Dec. 15, 1959 G. L. HATCHETT 2,917,601

PRINTED CIRCUIT RELAY

Filed Sept. 16, 1957

INVENTOR.
George Lee Hatchett

By Herbert E. Metcalf
His Patent Attorney

United States Patent Office 2,917,601

Patented Dec. 15, 1959

2,917,601

PRINTED CIRCUIT RELAY

George Lee Hatchett, Canoga Park, Calif., assignor to Northrop Corporation, Hawthorne, Calif., a corporation of California Application September 16, 1957, Serial No. 684,064

3 Claims. (Cl. 200—104)

This invention relates to electrical relays and more particularly to an electrical relay in which printed circuit techniques are employed.

Printed circuits per se are not new, however, it is only in recent years that they have been utilized to any great extent to replace conventional type circuits. Engineering and production personnel have now recognized the numerous advantages to be gained by the use of printed circuits and printed circuit components and accordingly they are currently in extensive use.

Of the many favorable characteristics of printed circuit components and installations unquestionably one of their most favorable characteristics is their space saving ability. Although printed circuit techniques have been applied to many electrical components it, to the best of applicant's knowlege, has never been employed to provide an electrical relay. Such a device, that is an electrical relay embodying printed circuit techniques, not only provides the aforementioned space saving advantage but also provides other novel and unique features which will become apparent as the disclosure progresses.

Accordingly it is an object of the present invention to provide an electrical relay which embodies printed circuit techniques and which requires a minimum of space for the installation thereof in electrical or electronic apparatus and the like.

Another object is to provide an electrical relay which embodies printed circuit techniques and which is constructed in a novel manner to effectively eliminate contact bounce and chatter.

Another object is to provide an electrical relay which embodies printed circuit techniques and which is of simple design and rugged construction, is especially resistant to vibration, shock and malfunctioning tendencies, and is economical to manufacture.

Although the characteristic features of the present invention are particularly pointed out in the appended claims, the invention itself, also the manner in which it may be carried out, will be better understood by referring to the following description taken in connection with the accompanying drawing forming a part of this application and in which:

Figure 1:
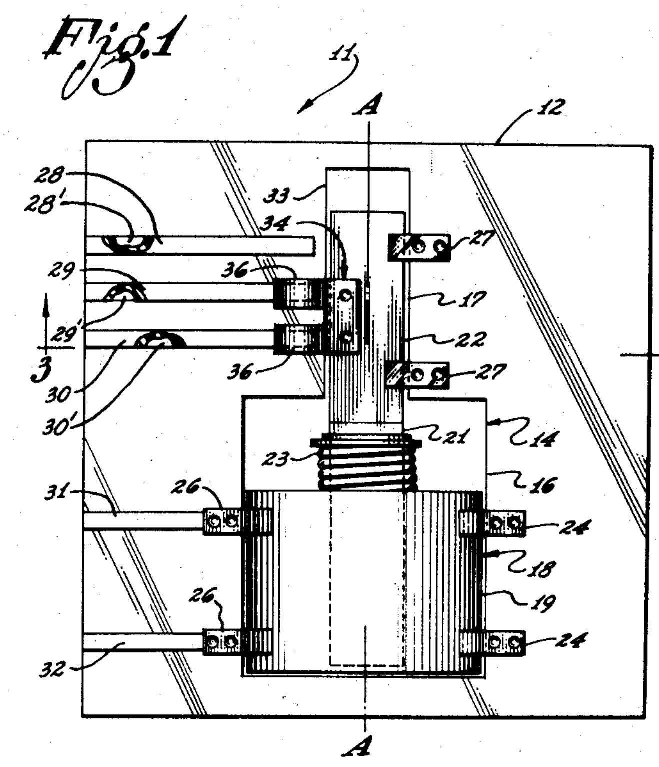
Figure 1 is a front elevational view of the electric relay as disclosed herein.
Figure 2:
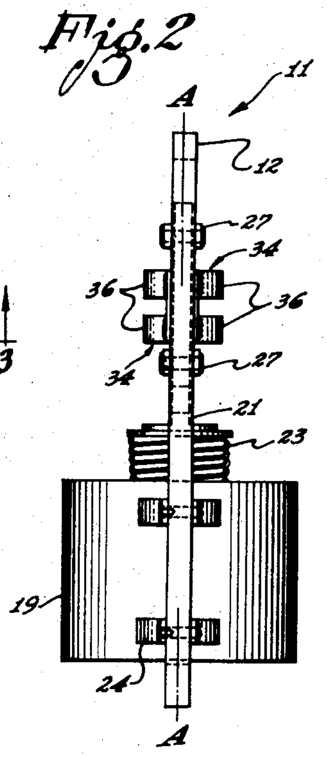
Figure 2 is a side elevational view of the relay shown in Figure 1.
Figure 3:
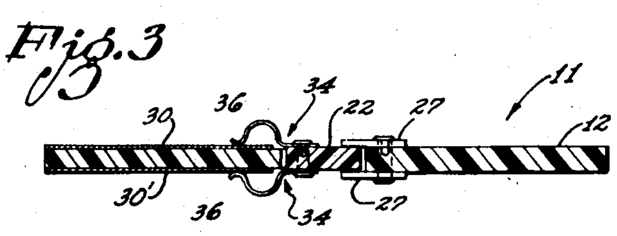
Figure 3 is a sectional view of the relay shown in Figure 1 as the same would appear as viewed along the line 3—3 of the latter figure.

Referring now to the drawing, Figures 1–3 show an electric relay assembly 11 of the type disclosed herein and which embodies printed circuit techniques. The term "printed circuit techniques" as used throughout the specification refers to electrical circuits which are processed on an outer surface of a dielectric material by any process, for example by printing, painting, spraying, chemical deposition, etc.

The relay assembly consists of a rectangular plate-like member 12 fabricated from a suitable material having a high dielectric constant. Suitable materials from which the element 12 may be fabricated include steatite, mica, plastic plate, etc. Formed in the member 12 is an aperture 14 which extends between the side faces of the member 12. The aperture 14 consists of a rectangular body portion 16 and a rectangular neck portion 17 which opens into the former portion. The portion 17 is of less width than the portion 16 and each of the portions have a respective longitudinal axis of symmetry which coincides with each other and is indicated by the reference line A—A. The portions 16 and 17 have a relative relation with respect to each other substantially as shown in Figure 1.

Mounted in the aperture 14 is a solenoid assembly 18 the major components of which include an electric coil 19, armature 21, slide member 22 and spring 23. The assembly 18 is of conventional construction and therefore needs no further explanation. However, it will be seen that the slide member 22 is elongated and is rectangular in cross-section having a width slightly less than the width of the neck portion 17 and a thickness equal to or slightly less than the thickness of the plate 12.

The assembly 18 is mounted in the aperture 14 substantially as shown in Figures 1 and 2. As mounted in the aperture it is seen that the longitudinal axis of the assembly 18 coincides with the reference line A—A and, therefore, the coil 19, armature 21, and spring 23 extend equally on each side of the plate 12. The solenoid assembly is secured in this position by mounting clips 24—24, 26—26 and 27—27.

Printed circuit type connectors 28—32 and 28′—30′ are processed on the side surfaces of the plate 12. All of the above connectors originate adjacent an edge of the plate 12 and extend inwardly in a direction normal to the reference line A—A. This pattern allows the outer ends of the above connectors to be readily attached to or make contact with other connectors (not shown) comprising components of the installation in which the component 11 is to be assembled. The connectors 31 and 32 are located on the same side of the plate 12 and their inner ends are respectively attached to the clips 26—26. The clips 26—26 serve the dual function of holding the coil 19 in position and also providing an electrical connection between the connectors 31 and 32 and the ends of the coil 19. The connectors 28, 29 and 30 are spaced from each other and terminate a short distance from the side edge 33 of the neck portion of the aperture 14. In the embodiment shown the connectors 28′, 29′ and 30′ are processed on the side of the plate 12 opposite the connectors 28, 29 and 30 and in similar positions.

The slide member 22 is fabricated of nonconducting material and is secured to the armature 21 by any suitable means. Secured to the member 22 at substantially the midpoint thereof, for example by riveting or the like, is a pair of contact elements 34. The elements 34 are constructed of an electrical conducting material and each is provided with a set of resilient finger-like portions 36. As attached to the member 22 the finger-like portions of one of the clips 34 oppose the finger-like portions of the other clip and bear against each of the side faces of the plate 12 in sliding relation as the coil 19 is energized and de-energized. Also it will be seen that the finger-like portions are substantially the same width and are spaced apart the same distances as the connectors 28, 29 and 30.

The various components of the relay assembly 11 and their relationship in the assembly having been described a discussion of the operation of the relay follows. In Figures 1 and 2 the armature 21 and slide member 22 are shown in their retracted position, a position which they assume at such times as the coil 19 is energized by current flowing through the connectors 31 and 32. In the retracted position of the armature 21 and member 22 the contact members 34—34 span the connectors 29—30 and 29′—30′, respectively. So positioned they provide respective paths for the flow of electric current between the connectors 29 and 30 and 29′ and 30′ as best seen in Figure 1. At such times as the coil is de-energized the spring 23 urges the armature and slide member to their extended position in which case the contact members 34—34 span the connectors 28—29 and 28′—29′, respectively. In the latter position the members 34—34 provide respective paths for the flow of electric current between the connectors 28 and 29 and 28′ and 29′.

Thus it will be seen that an electrical relay employing printed circuit techniques is provided which fulfills the objects of the invention. It is to be understood that the above embodiment is merely illustrative and various structural changes may be made thereto within the scope of the appended claims. For example, the coil mounting arrangement may be varied, various means may be employed in attaching the slide member to the armature, the cross-sectional configuration of the slide member may be varied, the pattern of the connectors may be varied from that shown, etc.

While in order to comply with the statute, the invention has been described in language more or less specific as to structural features, it is to be understood that the invention is not limited to the specific features shown, but that the means and construction herein disclosed comprise a preferred form of putting the invention into effect, and the invention is therefore claimed in any of its forms or modifications within the legitimate and valid scope of the appended claims.

What is claimed is:

1. In a printed circuit relay the combination comprising: a plate-like member fabricated of a dielectric material and having an aperture formed therein; a solenoid assembly including a hollow coil and armature; said armature includes an elongated bar member and is mounted in said coil to operate between retracted and extended positions therein during the energized and de-energized phases of said coil; said assembly is mounted in said aperture with the longitudinal axis of said bar member extending parallel to and between the side surfaces of said plate-like member; a plurality of individual printed circuit connectors formed on at least one surface of said plate-like member; a resilient contact element mounted on the end of said bar member to bear on each side of said plate-like member and contact a predetermined combination of said connectors to provide an electrical flow path therethrough when said armature is in said retracted position and contacts a different combination of said connectors to provide another electrical flow path through the latter connectors when said armature is in said extended position; and connector means connected to said coil for energizing the latter.

2. In a printed circuit relay the combination comprising: a plate-like member fabricated of a dielectric material having opposing major side faces and portions thereof defining an aperture extending between said major side faces; a hollow cylindrical coil and elongated armature assembled to provide a solenoid assembly the latter having an axis of symmetry; said armature includes an end portion constructed of dielectric material which extends from one end of said coil during the energized and de-energized phases of said coil; said assembly being attached to said plate-like member and positioned in said aperture with the axis of symmetry of said assembly lying in a plane parallel to and midway between said major side faces; a plurality of individual printed circuit connectors formed on at least one of the major side faces of said plate-like member; contact means rigidly secured to the dielectric end portion of said armature to contact a predetermined combination of said connectors to provide an electrical flow path therethrough when said armature is in said retracted position and contacts a different combination of said connectors when said armature is moved to said extended position to provide an electrical flow path through said different combination of connectors; and connector means connected to said coil adapted to carry electrical current to energize the latter.

3. Apparatus as set forth in claim 2: further characterized in that a plurality of individual printed circuit connectors are formed on the other major side face of said plate-like member, said contact means includes a pair of contact elements having resilient finger-like portions which oppose each other and contact respectively said one and other major side faces of said plate-like member and said contact element which is in contact with said other major side face contacts a predetermined combination of said connectors formed on said other major side face to provide an electric flow path therethrough when said armature is in said retracted position and contacts a different combination of said connectors on said other major side face when said armature is moved to said extended position to provide an electric flow path through the latter connectors.

References Cited in the file of this patent

UNITED STATES PATENTS

| | | |
|---|---|---|
| 473,595 | Thum | Apr. 26, 1892 |
| 806,009 | Scott | Nov. 28, 1905 |
| 814,946 | Dresser | Mar. 13, 1906 |
| 1,238,337 | Riley | Aug. 28, 1917 |
| 2,474,233 | Deakin | June 28, 1949 |
| 2,616,994 | Luhn | Nov. 4, 1952 |
| 2,790,875 | Bancroft | Apr. 30, 1957 |